(12) United States Patent
Pei

(10) Patent No.: US 8,535,446 B2
(45) Date of Patent: Sep. 17, 2013

(54) COATING HOLDER AND COATING DEVICE HAVING SAME

(75) Inventor: Shao-Kai Pei, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 440 days.

(21) Appl. No.: 12/944,656

(22) Filed: Nov. 11, 2010

(65) Prior Publication Data

US 2012/0048187 A1 Mar. 1, 2012

(30) Foreign Application Priority Data

Aug. 27, 2010 (TW) .............................. 99128721 A

(51) Int. Cl.
*C23C 16/00* (2006.01)
*B05C 13/02* (2006.01)
*B23Q 1/25* (2006.01)

(52) U.S. Cl.
USPC ........... 118/729; 118/500; 118/726; 118/728; 269/55

(58) Field of Classification Search
USPC .................................. 118/500, 726, 728–729
See application file for complete search history.

(56) References Cited

U.S. PATENT DOCUMENTS 3,318,283 A * 5/1967 Maclam et al. ............... 118/500
3,783,822 A * 1/1974 Wollam ........................ 118/725

\* cited by examiner

*Primary Examiner* — Dah-Wei Yuan
*Assistant Examiner* — Stephen Kitt
(74) *Attorney, Agent, or Firm* — Altis Law Group, Inc.

(57) ABSTRACT

A coating device includes a chamber, an evaporative source, a coating holder, and a supporting structure. The evaporative source is positioned at the bottom of the chamber. The coating holder is positioned at the top of the chamber and includes concentric annular parts with different diameters, and drive devices connected to the annular parts correspondingly. The drive devices are configured to move the annular parts along axial directions of the annular parts. Each annular part includes a bottom board defining receiving holes for receiving lenses. The supporting structure is positioned at the top of the chamber and supports the drive devices.

11 Claims, 3 Drawing Sheets

COATING HOLDER AND COATING DEVICE HAVING SAME

BACKGROUND

1. Technical Field

The present disclosure relates to coating technologies and, particularly, to a coating holder and a coating device using the coating holder.

2. Description of Related Art

Generally, in a coating process for workpieces (e.g., lenses), a spherical coating holder is used to hold several workpieces. However, although the workpieces are positioned on a spherical surface of the coating holder it is difficult and complicated to ensure that all surfaces to be coated are equidistant from an evaporative source. Often, correction plates must be utilized in an attempt to achieve uniform coating on all surfaces, which requires a lot of time and is not highly accurate since the process is manually executed.

What is needed, therefore, is a coating holder and a coating device having the same to overcome the above-described problem.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments.

DETAILED DESCRIPTION

Embodiments of the present disclosure will now be described in detail below, with reference to the accompanying drawings.

Figure 1:
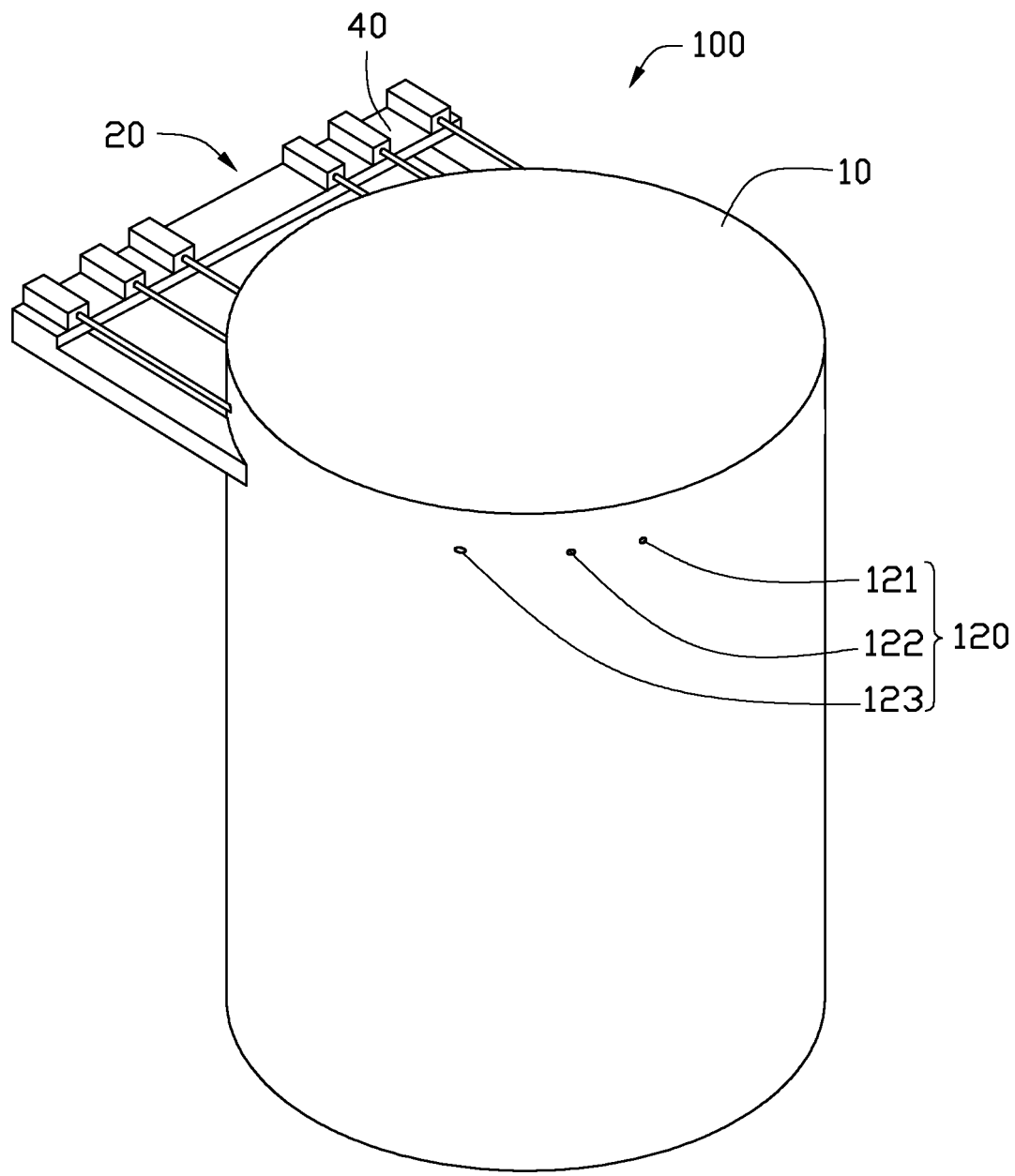
FIG. 1 is a schematic view of a coating device according to an exemplary embodiment.
Figure 2:
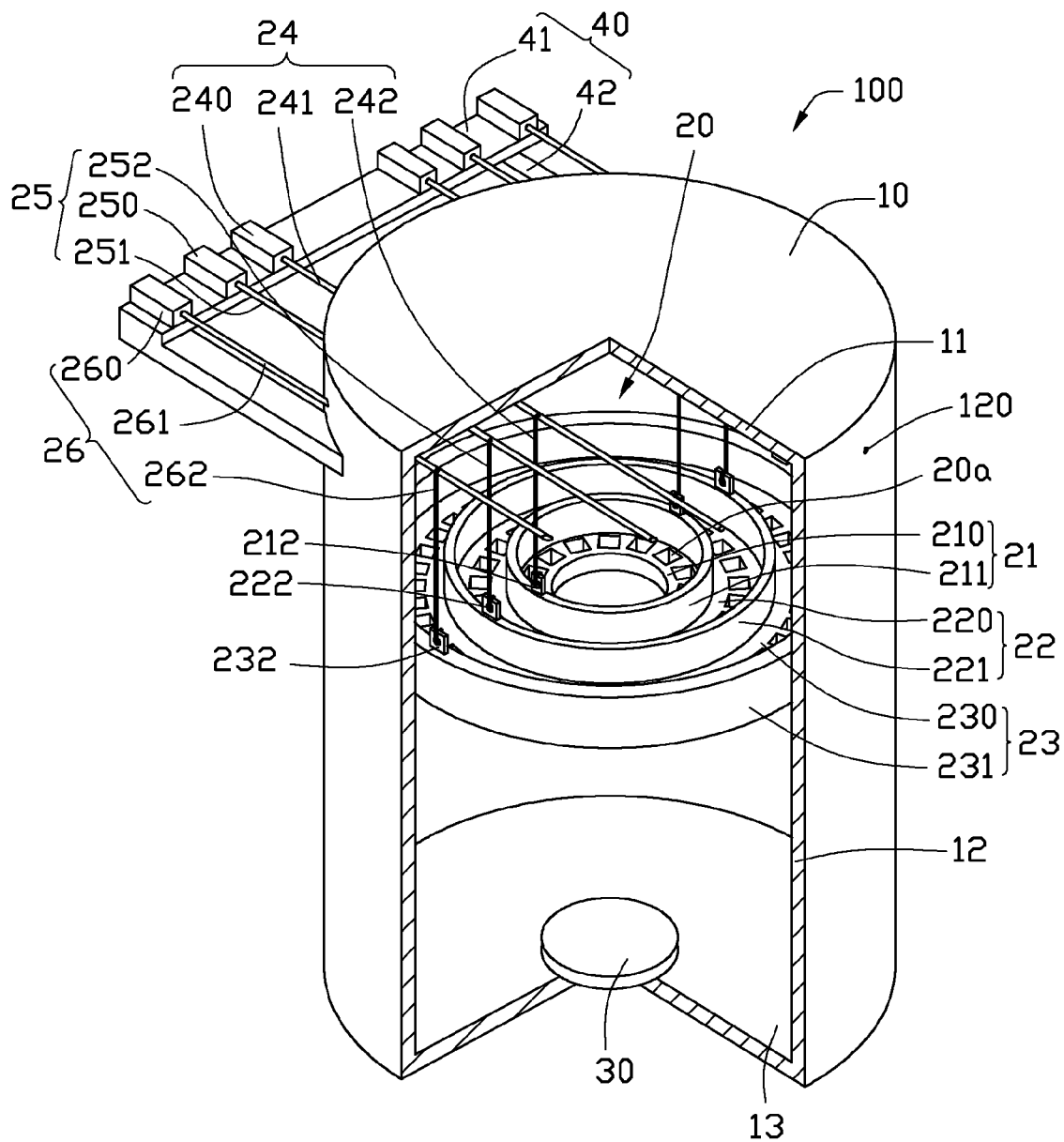
FIG. 2 is a cut-away, isometric view of the coating device of FIG. 1.

Referring to FIGS. 1-2, a coating device 100, according to an exemplary embodiment is shown. The coating device 100 includes a chamber 10, a holder 20, an evaporative source 30, and a supporting structure 40.

In the present embodiment, the coating device 100 is a vacuum coating device. The chamber 10 includes a top portion 11, a sidewall 12, and a base portion 13 opposite to the top portion 11. The sidewall 12 is connected between the top portion 11 and the base portion 13. The holder 20 is positioned at the top portion 11. The evaporative source 30 is received in the chamber 10, and fixed at the base portion 13. The sidewall 12 defines six pairs of through holes 121, 122, 123 on a same plane and aligned such that lines connecting the holes in each pair of holes 121, 122, 123 are parallel.

The holder 20 is used for holding lenses. In the present embodiment, the holder 20 includes a first annular part 21, a second annular part 22, a third annular part 23, a first drive device 24, a second drive device 25, and a third drive device 26. The number of the annular parts and the drive devices can be varied according to actual needs.

In the present embodiment, the first annular part 21, the second annular part 22, and the third annular part 23 are all barrel-shaped and coaxial with each other. In other embodiments, the shape of the first annular part 21, the second annular part 22, and the third annular part 23 can be polyhedron.

The first annular part 21 includes a first bottom board 210, a first annular wall 211, and two first lugs 212. The first bottom board 210 is disk-shaped. The first annular part 21 defines a number of receiving holes 20a for receiving lenses to be coated (not shown). The first annular wall 211 surrounds the first bottom board 210. The two first lugs 212 are fixed on the first annular wall 211 at opposite sides thereof.

The configuration of the second annular part 22 is similar to the first annular part 21 and includes a second bottom board 220, a second annular wall 221, and two second lugs 222. In the present embodiment, the inside diameter of the second annular part 22 is equal to or greater than the outside diameter of the first annular part 21. The second annular part 22 is sleeved over the first annular wall 211 of the first annular part 21.

The configuration of the third annular part 23 is similar to the second annular part 22 and includes a third bottom board 230, a third annular wall 231, and two third lugs 232. In the present embodiment, the inside diameter of the third annular part 23 is equal to or greater than the outside diameter of the second annular part 22. The third annular part 23 is sleeved over the second annular wall 221 of the second annular part 22. In the present embodiment, the first lugs 212, the second lugs 222, and the third lugs 232 are collinear, when the first annular part 21, the second annular part 22, and the third annular part 23 are at the same height.

In the present embodiment, the first drive device 24 includes two first motors 240, two first shafts 241, and two first strips 242. Each first shaft 241 is rotatably connected to the corresponding first motor 240. The first motors 240 are fixed on the supporting structure 40. The supporting structure 40 includes a beam 41 and two arms 42 connected to two opposite ends of the beam 41. The two arms 42 are joined to the outside surface of the sidewall 12. The connection point between the arms 42 and the chamber 20 is lower than the through hole 120. The two first motors 240 are fixed on the beam 41, and face the pair of through holes 121 respectively. The two first motors 240 can operate in synchronous rotation. In other embodiments, the first motors 240 can be received in the chamber 10. The first drive device 24 may, in other embodiments, include only one first motor 240 connected to both of the two first shafts 241, and the two first shafts 241 are configured to be able to rotate synchronously under control of a gear system or a chain system.

The first shafts 241 respectively extend through the two pairs of through holes 121. One end of each first strip 242 is fixed on the corresponding first lug 212, the other end of each first strip 242 is wound on the corresponding first shaft 241. The first strips 242 can be made of high temperature resistant material with belt, chain, or flexible tape like structures. In the present embodiment, the first strips 242 have belt-like structures. In other embodiments, each first shaft 241 may be sleeved by a barrel to increase its diameter within the chamber 10 so that fewer turns are required to wind the first strip 242. The first drive device 24 can be a hydraulic device or a pressure device and the first annular part 21 can be driven to move by the first drive device 24 through a piston rod.

The second drive device 25 includes two second motors 250, two second shafts 251, and two second strips 252. The configuration of the second drive device 25 is the same as the first drive device 24, except the two second motors 250 face the pair of through holes 122 respectively, and one end of the second strip 252 is fixed on the corresponding second lug 222.

The configuration of the third drive device 26 is the same as the first and the second drive devices 24,25 and includes two third motors 260, two third shafts 261, and two third strips 262. The two third motor 260 face the pair of through holes 123 respectively, and one end of the third strip 262 is fixed on the corresponding third lug 232. In the present embodiment, the first lugs 212, the second lugs 222, and the third lugs 232 are arranged at a same diameter, when the unwinding length of the first strip 242, the second strip 252, and the third strip 262 are the same.

Figure 3:
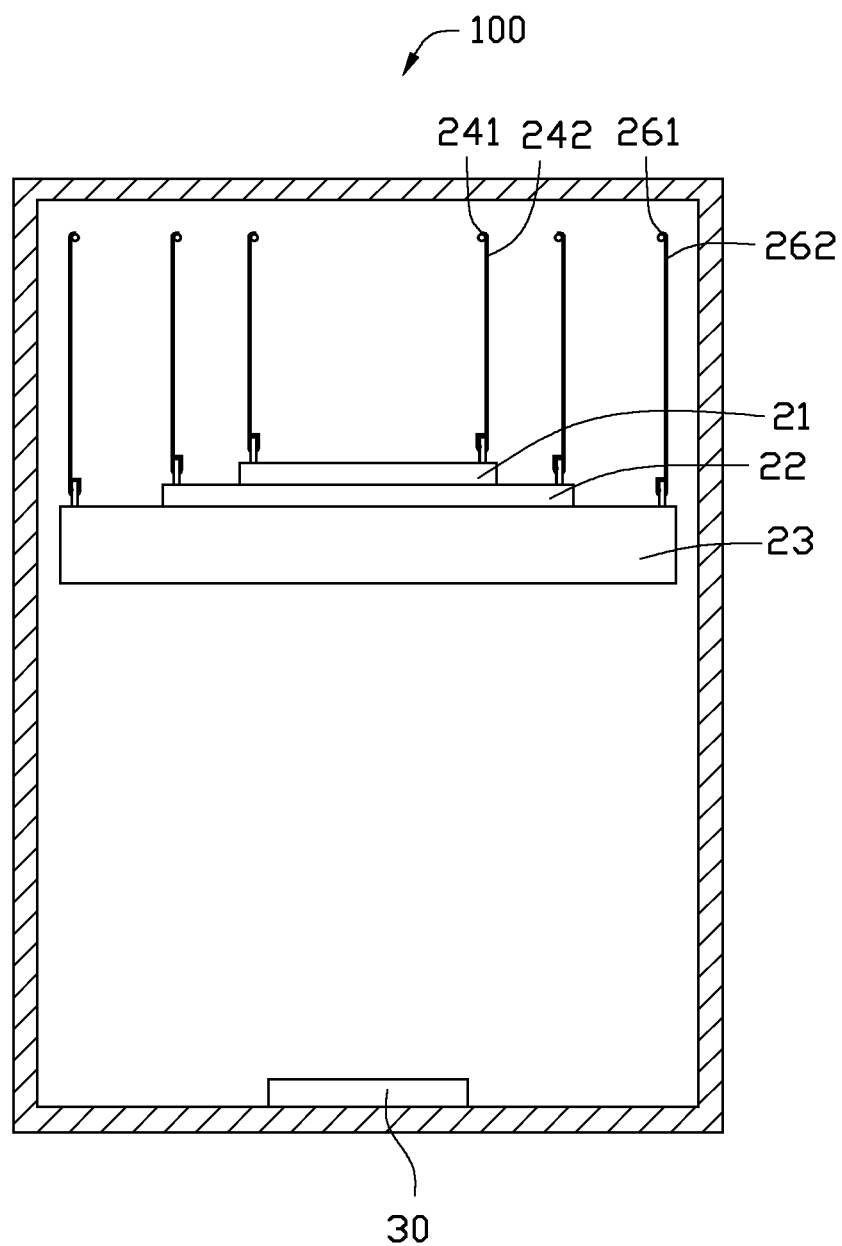
FIG. 3 is a sectional view of the coating device of FIG. 1.

Referring to FIG. 3, in the pre-coating process, the height of the first annular part 21, the second annular part 22, and the third annular part 23 can be adjusted to ensure the thickness of the film on the lenses positioned in different annular parts are uniform. It is assumed that the thickness of the film on the lenses received in the second annular part 22 will equal an acceptable level without need for adjustment, and the thickness of the film on the lenses received in the first annular part 21 and the third annular part 23 would not meet the acceptable level without adjustment. In this case to make all the lenses having the same thickness film, the first annular part 21 is raised to be a little farther from the source 30 than the second annular part 22. The third annular part 23 is lowered relative to the second annular part. In the present embodiment, the two first motors 240 synchronously rotate the two first shafts 241 to wind the two first strips 242. The first annular holder 21 is lifted to increase the distance between the evaporative source 30 and the first annular part 21. The two third motors 260 synchronously rotate the two third shafts 261 to wind the two third strips 262. The third annular holder 23 falls to decrease the distance between the evaporative source 30 and the third annular part 23.

While certain embodiments have been described and exemplified above, various other embodiments will be apparent to those skilled in the art from the foregoing disclosure. The present disclosure is not limited to the particular embodiments described and exemplified, and the embodiments are capable of considerable variation and modification without departure from the scope of the appended claims.

What is claimed is:

1. A coating holder comprising:
    a plurality of concentric annular parts with different diameters, each annular part comprising a bottom board defining a plurality of receiving holes for receiving lenses, an annular wall around the bottom board, and at least two lugs, the at least two lugs positioned on the annular wall, and;
    at least two drive device, each drive device comprising at least two motors, at least two shafts, and at least two strips, each shaft rotatably connected to a respective one of the at least two motors, one end of each strip fixed on a respective one of the at least two lugs, the other end of each strip wound on a respective one of the at least two shafts, wherein, in a pre-coating process, a height of the concentric annular parts is adjusted when the motors synchronously rotate the shafts to wind the strips to move the annular parts along axial directions of the annular parts.

2. The coating holder as claimed in claim 1, wherein the inside diameter of a larger annular part is equal to the outside diameter of a smaller annular part adjacent to the larger annular part.

3. The coating holder as claimed in claim 1, wherein each annular part comprises two lugs, the two lugs are symmetrically positioned on the annular wall around the center of the annular wall.

4. The coating holder as claimed in claim 1, wherein the bottom board is disk-shaped.

5. A coating device comprising:
    a chamber;
    an evaporative source positioned at the bottom of the chamber;
    a coating holder positioned at the top of the chamber, and comprising:
        a plurality of concentric annular parts with different diameters, each annular part comprising a bottom board defining a plurality of receiving holes for receiving lenses, an annular wall around the bottom board, and at least two lugs, the at least two lugs positioned on the annular wall; and
        a plurality of drive devices connected to the annular parts correspondingly, each drive device comprising at least two motors, at least two shafts, and at least two strips, each shaft rotatable connected to a respective one the at least two motors, one end of each strip fixed on a respective one of the at least two lugs, the other end of each strip wound on a respective one of the at least two shafts, wherein, in a pre-coating process, a height of the concentric annular parts is adjusted when the motors synchronously rotate to move the annular parts along axial directions of the annular parts; and
        a supporting structure positioned at the top of the chamber and supporting the drive devices.

6. The coating device as claimed in claim 5, wherein the inside diameter of a larger annular part is equal to the outside diameter of a smaller annular part adjacent to the larger annular part.

7. The coating device as claimed in claim 5, wherein each annular part comprises two lugs, the two lugs are symmetrically positioned on the annular wall around the center of the annular wall.

8. The coating device as claimed in claim 5, wherein each of the at least two strips is selected from the group consisting of belt and chain, the belt and the chain are made of high temperature resistant materials.

9. The coating device as claimed in claim 5, wherein the bottom board is disk-shaped.

10. The coating device as claimed in claim 5, wherein the supporting structure comprises a beam and two arms connected to two opposite ends of the beam.

11. The coating device as claimed in claim 5, wherein the chamber comprises a top portion, a sidewall, and a base portion opposite to the top portion, the sidewall is connected between the top portion and the base portion, the coating holder is positioned on the top portion, the evaporative source is fixed on the base portion, the sidewall defines at least two pairs of through holes on the same plane, the connection point between the arms and the chamber is lower than the through holes, the at least two motors are fixed on the beam, and face the two pairs of through holes respectively, the at least two shafts respectively extend through the at least two pairs of through holes.

* * * * *